(12) United States Patent
Yoon et al.

(10) Patent No.: US 10,622,293 B2
(45) Date of Patent: Apr. 14, 2020

(54) SEMICONDUCTOR DEVICE AND METHOD FOR FORMING A LOW PROFILE EMBEDDED WAFER LEVEL BALL GRID ARRAY MOLDED LASER PACKAGE (EWLB-MLP)

(71) Applicant: JCET Semiconductor (Shaoxing) Co., Ltd., Shaoxing (CN)

(72) Inventors: Seung Wook Yoon, Singapore (SG); Jose A. Caparas, Singapore (SG); Yaojian Lin, Singapore (SG); Pandi C. Marimuthu, Singapore (SG); Kang Chen, Singapore (SG); Xusheng Bao, Singapore (SG); Jianmin Fang, Singapore (SG)

(73) Assignee: JCET Semiconductor (Shaoxing) Co., Ltd. (CN)

( * ) Notice: Subject to any disclaimer, the term of this patent is extended or adjusted under 35 U.S.C. 154(b) by 57 days.

(21) Appl. No.: 15/007,518

(22) Filed: Jan. 27, 2016

(65) Prior Publication Data
US 2016/0141238 A1 May 19, 2016

Related U.S. Application Data

(60) Continuation of application No. 13/772,683, filed on Feb. 21, 2013, now Pat. No. 9,293,401, which is a
(Continued)

(51) Int. Cl.
*H01L 23/498* (2006.01)
*H01L 21/768* (2006.01)
(Continued)

(52) U.S. Cl.
CPC ...... *H01L 23/49827* (2013.01); *H01L 21/311* (2013.01); *H01L 21/56* (2013.01);
(Continued)

(58) Field of Classification Search
USPC .................................................. 257/737–778
See application file for complete search history.

(56) References Cited

U.S. PATENT DOCUMENTS 5,250,843 A  10/1993  Eichelberger
5,353,498 A  10/1994  Fillion et al.
(Continued)

FOREIGN PATENT DOCUMENTS

CN  101075580 A  11/2007
CN  101996893 A  3/2011
(Continued)

*Primary Examiner* — Herve-Louis Y Assouman
(74) *Attorney, Agent, or Firm* — Robert D. Atkins; Patent Law Group: Atkins and Associates, P.C.

(57) ABSTRACT

A semiconductor device has a semiconductor die with an encapsulant deposited over and around the semiconductor die. An interconnect structure is formed over a first surface of the encapsulant. An opening is formed from a second surface of the encapsulant to the first surface of the encapsulant to expose a surface of the interconnect structure. A bump is formed recessed within the opening and disposed over the surface of the interconnect structure. A semiconductor package is provided. The semiconductor package is disposed over the second surface of the encapsulant and electrically connected to the bump. A plurality of interconnect structures is formed over the semiconductor package to electrically connect the semiconductor package to the bump. The semiconductor package includes a memory device. The semiconductor device includes a height less than 1 millimeter. The opening includes a tapered sidewall formed by laser direct ablation.

25 Claims, 10 Drawing Sheets

Related U.S. Application Data continuation-in-part of application No. 13/191,318, filed on Jul. 26, 2011, now Pat. No. 9,082,806, which is a continuation-in-part of application No. 12/572,590, filed on Oct. 2, 2009, now Pat. No. 8,796,846, which is a division of application No. 12/333,977, filed on Dec. 12, 2008, now Pat. No. 7,642,128.

(60) Provisional application No. 61/606,327, filed on Mar. 2, 2012, provisional application No. 61/441,561, filed on Feb. 10, 2011, provisional application No. 61/444,914, filed on Feb. 21, 2011.

(51) Int. Cl.
  *H01L 21/56* (2006.01)
  *H01L 23/00* (2006.01)
  *H01L 21/311* (2006.01)
  *H01L 25/10* (2006.01)
  *H01L 23/31* (2006.01)

(52) U.S. Cl.
  CPC ...... *H01L 21/561* (2013.01); *H01L 21/76804* (2013.01); *H01L 23/49811* (2013.01); *H01L 23/49816* (2013.01); *H01L 23/49838* (2013.01); *H01L 24/19* (2013.01); *H01L 24/96* (2013.01); *H01L 24/97* (2013.01); *H01L 25/105* (2013.01); *H01L 21/568* (2013.01); *H01L 23/3128* (2013.01); *H01L 2224/12105* (2013.01); *H01L 2224/97* (2013.01); *H01L 2225/1035* (2013.01); *H01L 2225/1058* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/3511* (2013.01)

(56) References Cited

U.S. PATENT DOCUMENTS

| | | | |
|---|---|---|---|
| 5,841,193 A | 11/1998 | Eichelberger | |
| 5,987,744 A | 11/1999 | Lan et al. | |
| 6,002,169 A | 12/1999 | Chia et al. | |
| 6,423,570 B1 | 7/2002 | Ma et al. | |
| 6,750,547 B2 | 6/2004 | Jeung et al. | |
| 6,753,602 B2 | 6/2004 | Wu | |
| 6,958,546 B2 | 10/2005 | Fan et al. | |
| 6,998,344 B2 | 2/2006 | Akram et al. | |
| 7,545,047 B2 | 6/2009 | Bauer et al. | |
| 7,548,430 B1 | 6/2009 | Huemoeller et al. | |
| 7,619,901 B2 * | 11/2009 | Eichelberger | H01L 21/6835 361/763 |
| 7,737,565 B2 | 6/2010 | Coffy | |
| 7,777,351 B1 * | 8/2010 | Berry | H01L 23/3128 257/778 |
| 7,816,183 B2 | 10/2010 | Kawata | |
| 7,834,462 B2 | 11/2010 | Dobritz et al. | |
| 7,851,259 B2 | 12/2010 | Kim | |
| 8,101,460 B2 | 1/2012 | Pagaila | |
| 2003/0042581 A1 | 3/2003 | Fee et al. | |
| 2003/0116861 A1 | 6/2003 | Jeung et al. | |
| 2004/0145044 A1 | 7/2004 | Sugaya et al. | |
| 2005/0236709 A1 | 10/2005 | Eng et al. | |
| 2006/0278972 A1 * | 12/2006 | Bauer | H01L 21/561 257/701 |
| 2007/0249102 A1 * | 10/2007 | Brunnbauer | H01L 21/568 438/127 |
| 2008/0111233 A1 | 5/2008 | Pendse | |
| 2008/0157328 A1 * | 7/2008 | Kawata | H01L 21/561 257/686 |
| 2008/0169546 A1 | 7/2008 | Kwon et al. | |
| 2008/0258289 A1 | 10/2008 | Pendse | |
| 2008/0284045 A1 | 11/2008 | Gerber et al. | |
| 2008/0308928 A1 | 12/2008 | Chang et al. | |
| 2008/0315385 A1 | 12/2008 | Gerber et al. | |
| 2009/0075428 A1 | 3/2009 | Tang et al. | |
| 2009/0155956 A1 * | 6/2009 | Pohl | H01L 21/568 438/109 |
| 2009/0212420 A1 | 8/2009 | Hedler et al. | |
| 2009/0236686 A1 | 9/2009 | Shim et al. | |
| 2009/0309212 A1 | 12/2009 | Shim et al. | |
| 2010/0117218 A1 | 5/2010 | Park et al. | |
| 2010/0140813 A1 | 6/2010 | Pagaila et al. | |
| 2010/0171205 A1 | 7/2010 | Chen et al. | |
| 2010/0171207 A1 | 7/2010 | Shen et al. | |
| 2010/0224974 A1 | 9/2010 | Shim et al. | |
| 2010/0317153 A1 | 12/2010 | Do et al. | |
| 2011/0031634 A1 | 2/2011 | Pagaila | |
| 2011/0117700 A1 | 5/2011 | Weng et al. | |
| 2011/0204509 A1 | 8/2011 | Lin et al. | |
| 2011/0227220 A1 | 9/2011 | Chen et al. | |
| 2012/0306104 A1 | 12/2012 | Choi et al. | |
| 2013/0249106 A1 | 9/2013 | Lin et al. | |
| 2014/0103509 A1 | 4/2014 | Yoon et al. | |

FOREIGN PATENT DOCUMENTS

| | | |
|---|---|---|
| CN | 102194711 A | 9/2011 |
| KR | 20100009941 A | 1/2010 |
| TW | 201104770 A | 2/2011 |

* cited by examiner

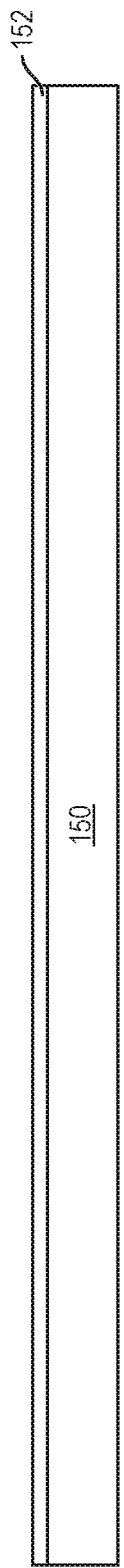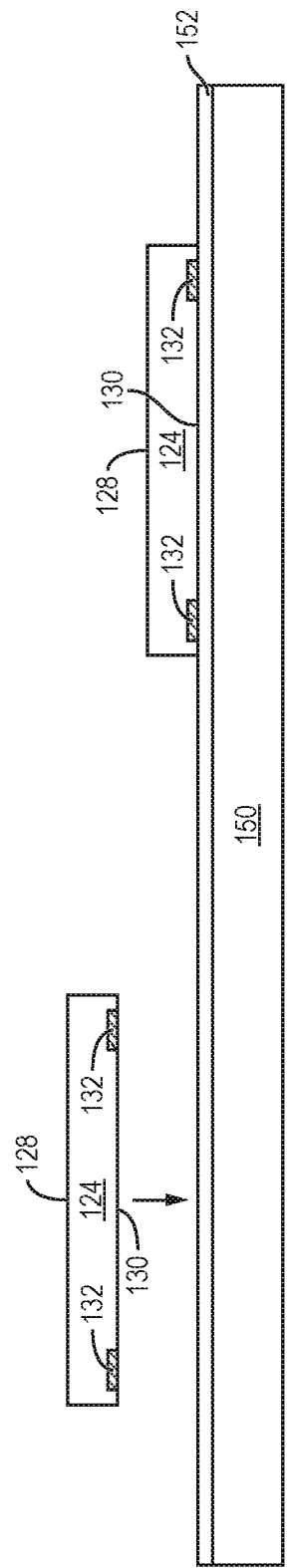

SEMICONDUCTOR DEVICE AND METHOD FOR FORMING A LOW PROFILE EMBEDDED WAFER LEVEL BALL GRID ARRAY MOLDED LASER PACKAGE (EWLB-MLP)

CLAIM TO DOMESTIC PRIORITY

The present application is a continuation of U.S. patent application Ser. No. 13/772,683, now U.S. Pat. No. 9,293,401, filed Feb. 21, 2013, which claims the benefit of U.S. Provisional Application No. 61/606,327, filed Mar. 2, 2012, and U.S. application Ser. No. 13/772,683 is a continuation-in-part of U.S. patent application Ser. No. 13/191,318, now U.S. Pat. No. 9,082,806, filed Jul. 26, 2011, which claims the benefit of U.S. Provisional Application No. 61/441,561, filed Feb. 10, 2011, and U.S. Provisional Application No. 61/444,914, filed Feb. 21, 2011, and U.S. patent application Ser. No. 13/191,318 is a continuation-in-part of U.S. patent application Ser. No. 12/572,590, now U.S. Pat. No. 8,796,846, filed Oct. 2, 2009, which is a division of U.S. application Ser. No. 12/333,977, now U.S. Pat. No. 7,642,128, filed Dec. 12, 2008, which applications are incorporated herein by reference.

FIELD OF THE INVENTION

The present invention relates in general to semiconductor devices and, more particularly, to a semiconductor device and method of forming a fan-out embedded wafer level ball grid array (Fo-eWLB).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A common semiconductor device arrangement includes an upper semiconductor package stacked over a lower semiconductor package, i.e., package-on-package (PoP). The upper semiconductor package is typically electrically connected to the lower semiconductor package with bumps. The interconnect bumps are bonded to an interconnect structure on the lower semiconductor package. The interconnect bumps add height to the PoP arrangement and can lead to warpage of the semiconductor device.

SUMMARY OF THE INVENTION

A need exists for a robust interconnect structure and PoP device with reduced package height and better warpage control. Accordingly, in one embodiment, the present invention is a method of making a semiconductor device comprising the steps of providing a semiconductor die, depositing an encapsulant over and around the semiconductor die including a first surface of the encapsulant, and planarizing the encapsulant to form a planar second surface of the encapsulant opposite the first surface. The method further includes the steps of forming an interconnect structure under the first surface of the encapsulant and the semiconductor die, forming an opening extending from the planar second surface of the encapsulant to the first surface of the encapsulant, and forming a bump within the opening and connected to the interconnect structure. The opening includes a tapered sidewall formed by laser direct ablation.

In another embodiment, the present invention is a method of making a semiconductor device comprising the steps of providing a substrate, disposing a semiconductor die over the substrate, depositing an encapsulant over the substrate and semiconductor die, forming an interconnect structure under the first surface of the encapsulant, and forming an opening in the planar second surface of the encapsulant. A first surface of the encapsulant is coplanar with a first surface of the substrate. A planar second surface of the encapsulant is opposite the first surface of the encapsulant.

In another embodiment, the present invention is a semiconductor device comprising an interconnect structure. A semiconductor die is disposed over the interconnect structure. An encapsulant is disposed over and around the semiconductor die. A first surface of the encapsulant is coplanar with a first surface of the interconnect structure. A planar second surface of the encapsulant is opposite the first surface of the encapsulant and over a back surface of the semiconductor die opposite an active surface of the semiconductor die. An opening is formed in the planar surface of the encapsulant extending to the interconnect structure. A bump is formed over the interconnect structure and recessed within the opening.

In another embodiment, the present invention is a semiconductor device comprising a semiconductor die. An encapsulant is disposed over and around the semiconductor die. The encapsulant includes a first surface of the encapsulant. A planar second surface of the encapsulant is opposite the first surface of the encapsulant and over a back surface of the semiconductor die opposite an active surface of the semiconductor die. An opening is formed in the planar surface of the encapsulant extending to the first surface of the encapsulant. A bump is formed recessed within the opening.

DETAILED DESCRIPTION OF THE DRAWINGS

Figure 1:
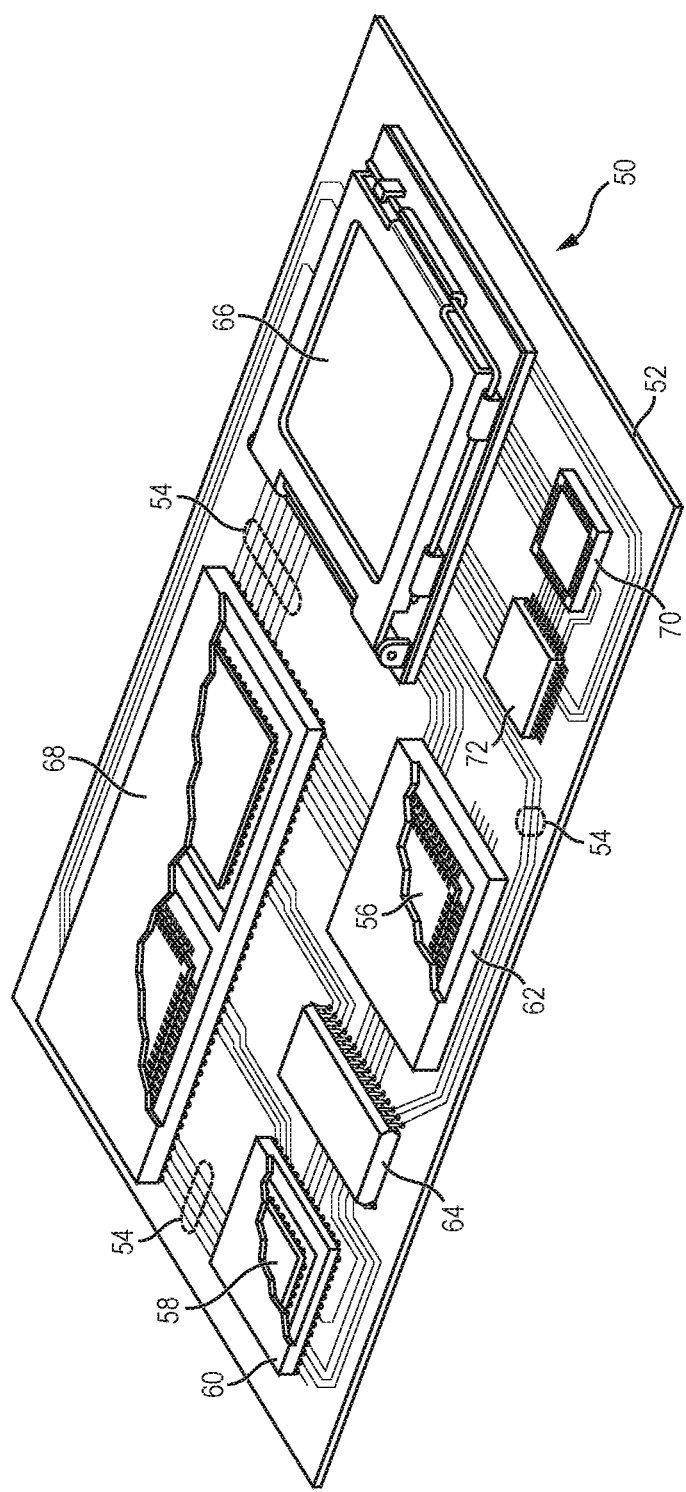
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
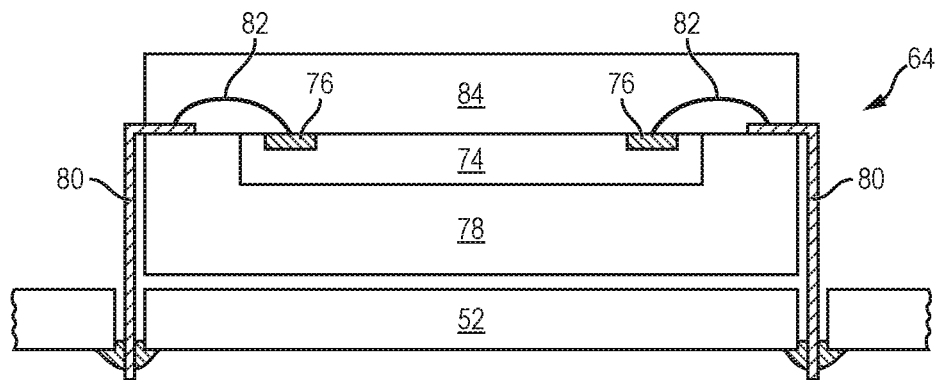
FIGS. 2a-2c illustrate further detail of the representative semiconductor packages mounted to the PCB.
Figure 2B:
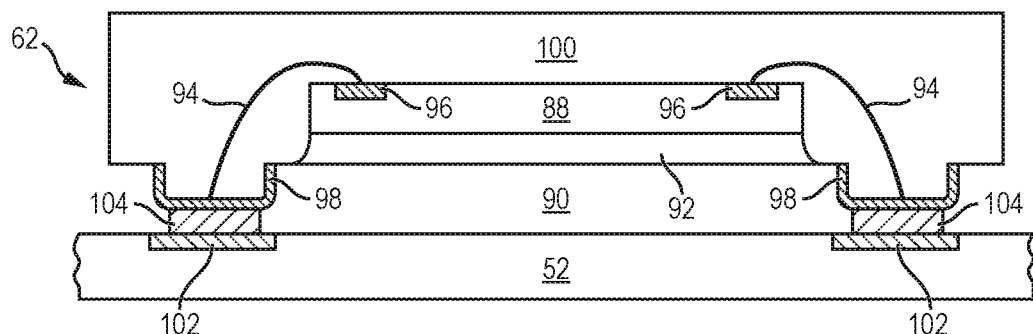
Figure 2C:
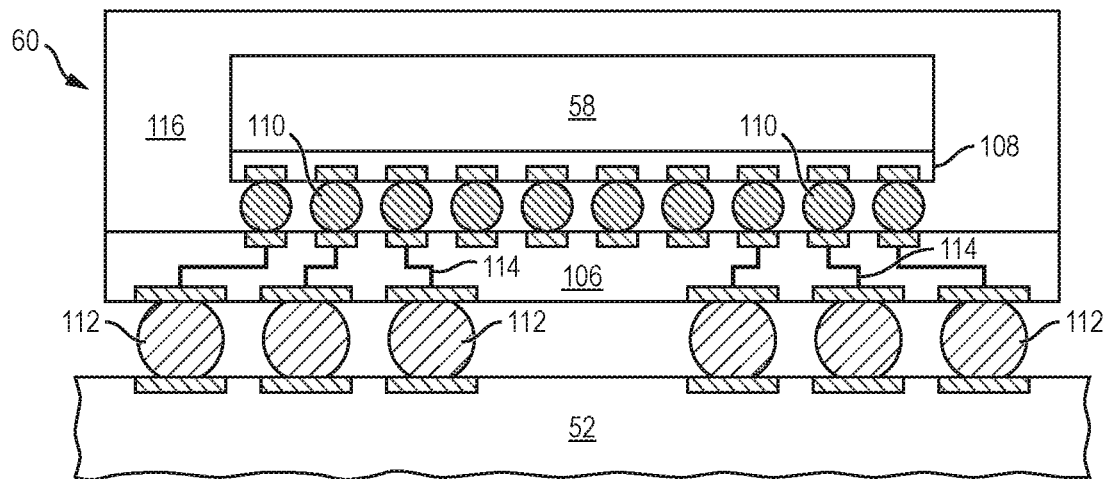

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
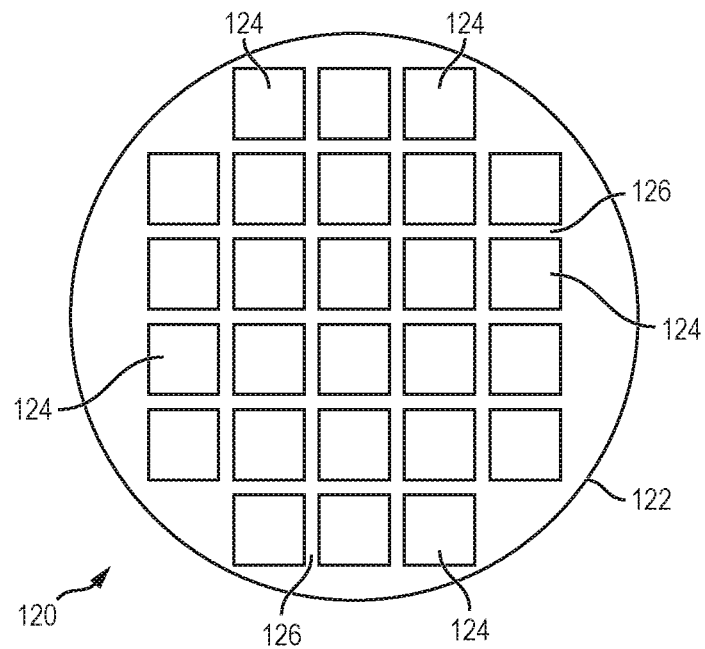
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
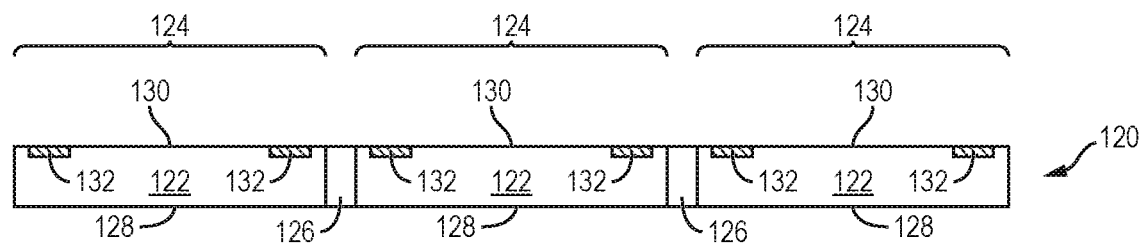

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
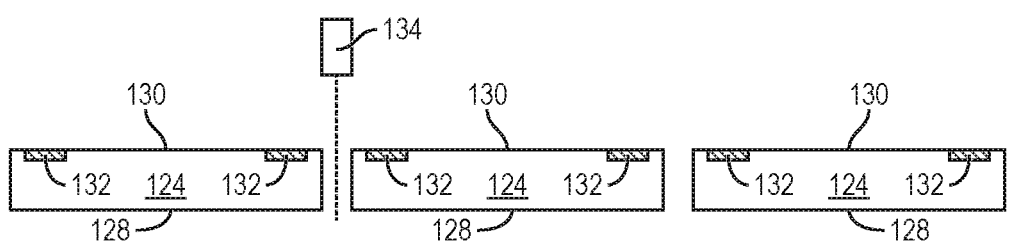

In FIG. 3c, semiconductor wafer 120 is singulated through saw street 126 using a saw blade or laser cutting tool 134 into individual flipchip type semiconductor die 124. Alternatively, singulation of semiconductor wafer 120 can be accomplished using a water jet to remove material within saw street 126.

Figure 4C:
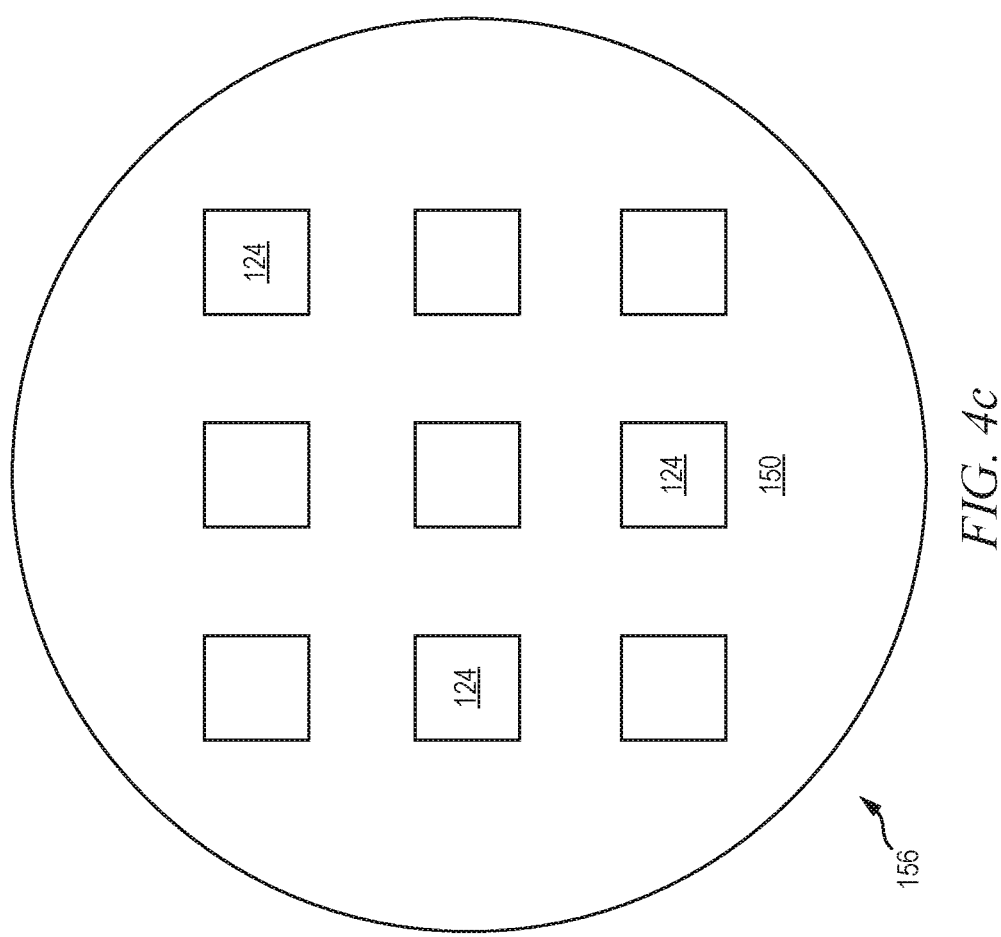
FIGS. 4a-4n illustrate a process of forming a fan-out embedded wafer level ball grid array (Fo-eWLB) including a thin film interconnect structure and recessed vertical interconnects with tapered sidewalls.

FIGS. 4a-4m illustrate a process of forming a low profile PoP device having an embedded eWLB-MLP with fine I/O pitch and low height. FIG. 4a shows a portion of substrate or carrier 150 containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 152 is formed over carrier 150 as a temporary adhesive bonding film, etch-stop layer, or release layer.

In FIG. 4b, semiconductor die 124 from FIG. 3c are mounted to interface layer 152 and over carrier 150 using, for example, a pick and place operation with active surface 130 oriented toward the carrier.

Semiconductor die 124 from FIGS. 3a-3c is positioned over and mounted to carrier 150 using a pick and place operation with contact pads 132 oriented toward the carrier. FIG. 4b shows semiconductor die 124 mounted to carrier 150. Carrier 150 has sufficient area to hold many semiconductor die 124 as a reconstituted wafer 156. FIG. 4c shows a plan view of reconstituted wafer 156 with a plurality of semiconductor die 124 mounted to carrier 150 and separated by a distance.

Figure 4D:
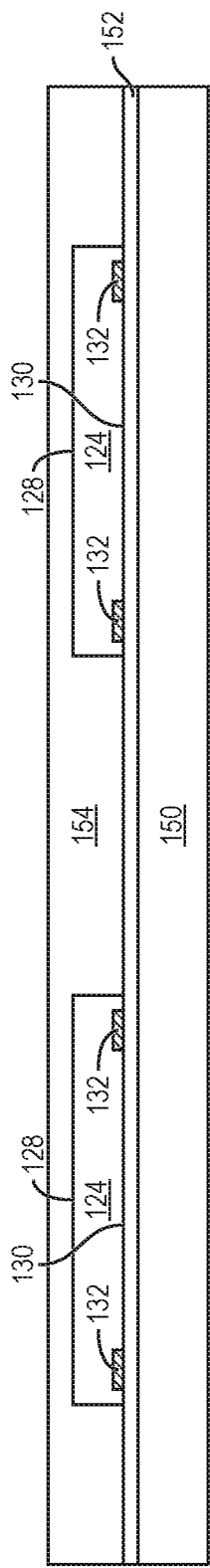

In FIG. 4d, an encapsulant or molding compound 154 is deposited over interface layer 152 and carrier 150 and over and around semiconductor die 124 using a paste printing, compressive molding, transfer molding, liquid encapsulant molding, vacuum lamination, film-assisted molding, spin coating, or other suitable applicator. Encapsulant 154 is formed over back surface 128 of semiconductor die 124, and can be thinned in a subsequent backgrinding step. Encapsulant 154 can also be deposited such that the encapsulant is coplanar with back surface 128, and does not cover the back surface. Encapsulant 154 can be polymer composite material, such as epoxy resin with filler, epoxy acrylate with filler, or polymer with proper filler. Encapsulant 154 is nonconductive, provides physical support, and environmentally protects the semiconductor device from external elements and contaminants.

Figure 4E:
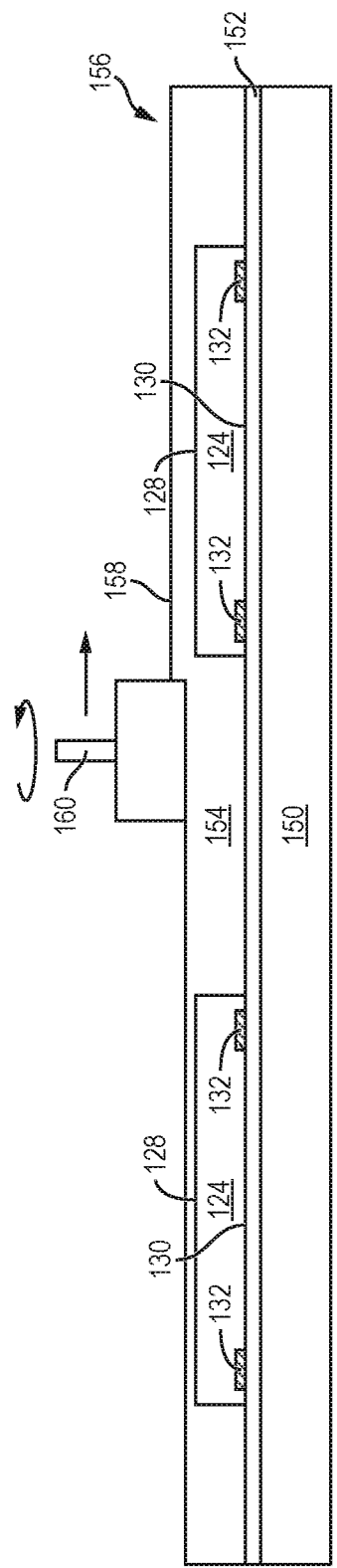

FIG. 4e shows composite substrate or reconstituted wafer 156 covered by encapsulant 154. In FIG. 4e, surface 158 of encapsulant 154 undergoes a grinding operation with grinder 160 to planarize the surface and reduce thickness of the encapsulant. A chemical etch can also be used to remove and planarize encapsulant 154. A portion of encapsulant 154 is removed to thin the encapsulant. A portion of encapsulant 154 can also be removed to expose or thin the back surface of semiconductor die 124.

Figure 4F:
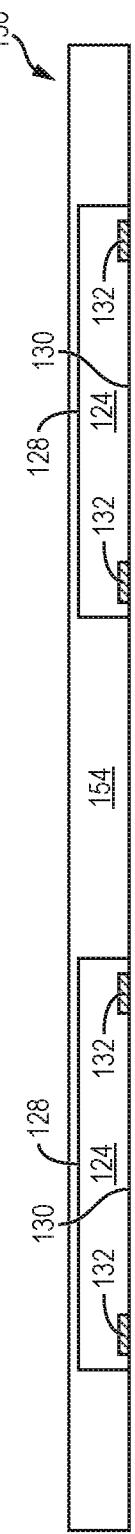

In FIG. 4f, carrier 150 and interface layer 152 are removed from composite substrate 156 by chemical etching, mechanical peeling, chemical mechanical planarization (CMP), mechanical grinding, thermal bake, UV light, laser scanning, or wet stripping to facilitate the formation of an interconnect structure over active surface 130 of semiconductor die 124 and encapsulant 154 around a periphery of the semiconductor die.

Figure 4G:
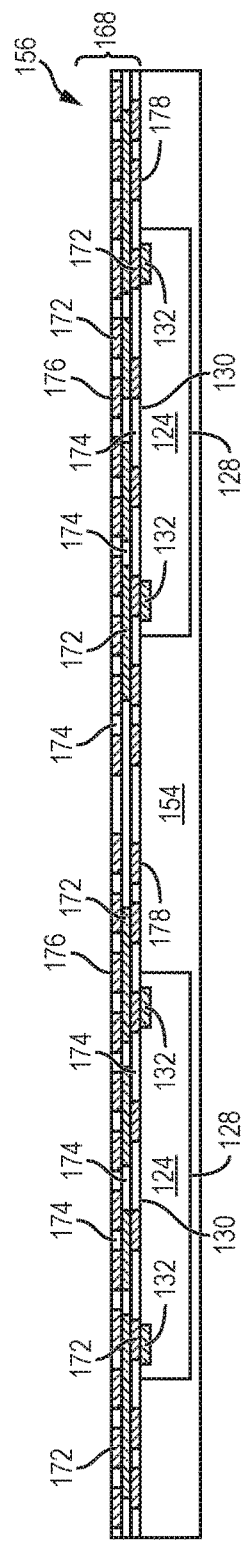

In FIG. 4g, a build-up interconnect structure 168 is formed over encapsulant 154 and semiconductor die 124. Build-up interconnect structure 168 includes an electrically conductive layer or redistribution layer (RDL) 172 formed using a patterning and metal deposition process such as sputtering, electrolytic plating, and electroless plating. Conductive layer 172 can be one or more layers of Al, Cu, Sn, Ni, Au, Ag, or other suitable electrically conductive material. Conductive layer 172 is electrically connected to contact pads 132. Other portions of conductive layer 172 can be electrically common or electrically isoated depending on the design and function of semiconductor die 124.

Build-up interconnect structure 168 further includes an insulating or passivation layer 174 formed between conductive layer 172 for electrical isolation using PVD, CVD, printing, spin coating, spray coating, sintering or thermal oxidation. The insulating layer 174 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. In one embodiment, build up interconnect structure 168 has a line width/spacing of 10 micrometers (μm)/10 μm.

Figure 4H:
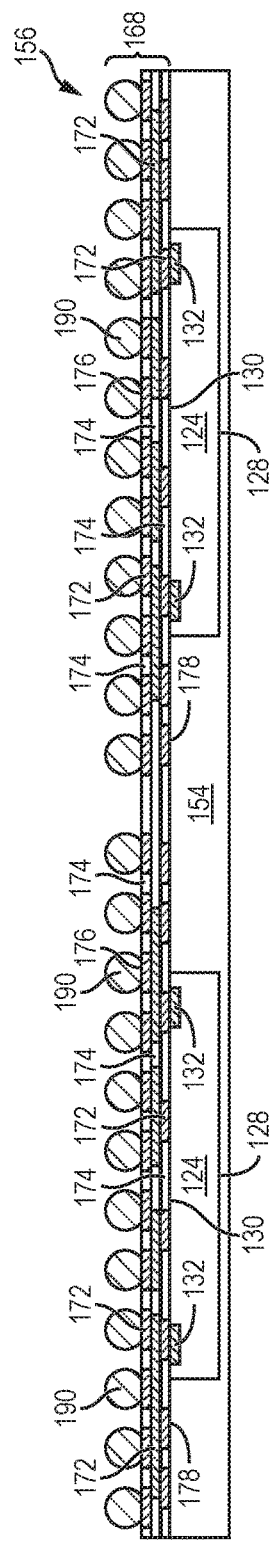

In FIG. 4h, an electrically conductive bump material is deposited over build-up interconnect structure 168 and electrically connected to conductive layer 172 on surface 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form balls or bumps 190. In some applications, bumps 190 are reflowed a second time to improve electrical contact to conductive layer 172. An under bump metallization (UBM) layer can be formed under bumps 190. Bumps 190 can also be compression bonded to conductive layer 172. Bumps 190 represent one type of interconnect structure that can be formed over conductive layer 172. The interconnect structure can also use bond wires, stud bump, micro bump, or other electrical interconnect.

Figure 4I:
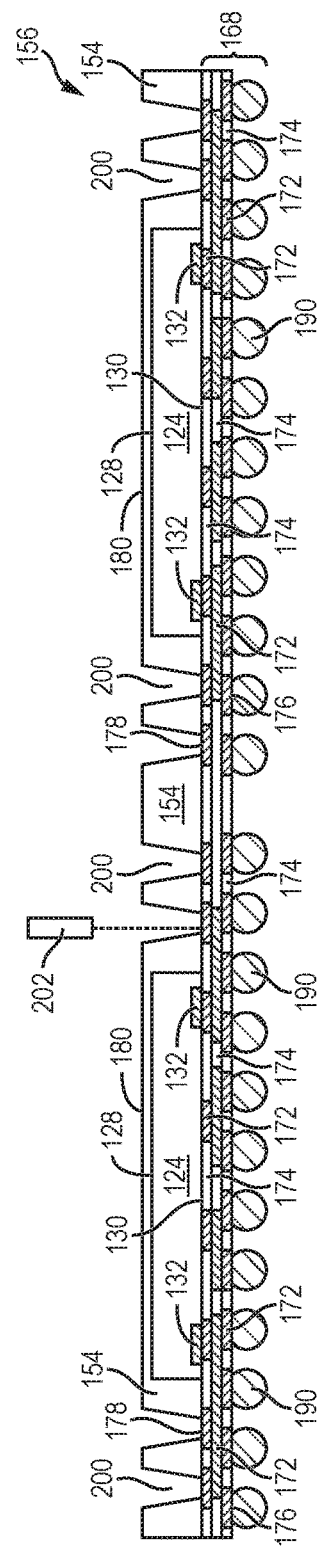

In FIG. 4i, a portion of encapsulant 154 is removed by laser direct ablation (LDA) using laser 202 to form openings or vias 200 extending down to conductive layer 172 of interconnect structure 168. Alternatively, openings 200 can be formed by an etching process through a patterned photoresist layer. Openings 200 have a tapered shape including a larger diameter at the top of opening 200 and a smaller diameter at the bottom of opening 200. The tapered via shape enables stable solder ball loading when inserting bump material 206 into opening 200. The tapered via shape also provides stable bump material heights for uniform PoP stacking. After openings 200 are formed, openings 200 and exposed conductive layer 172 are cleaned. A residue free surface of conductive layer 172 provides improved solder wetting and electrical continuity for PoP stacking.

Figure 4J:
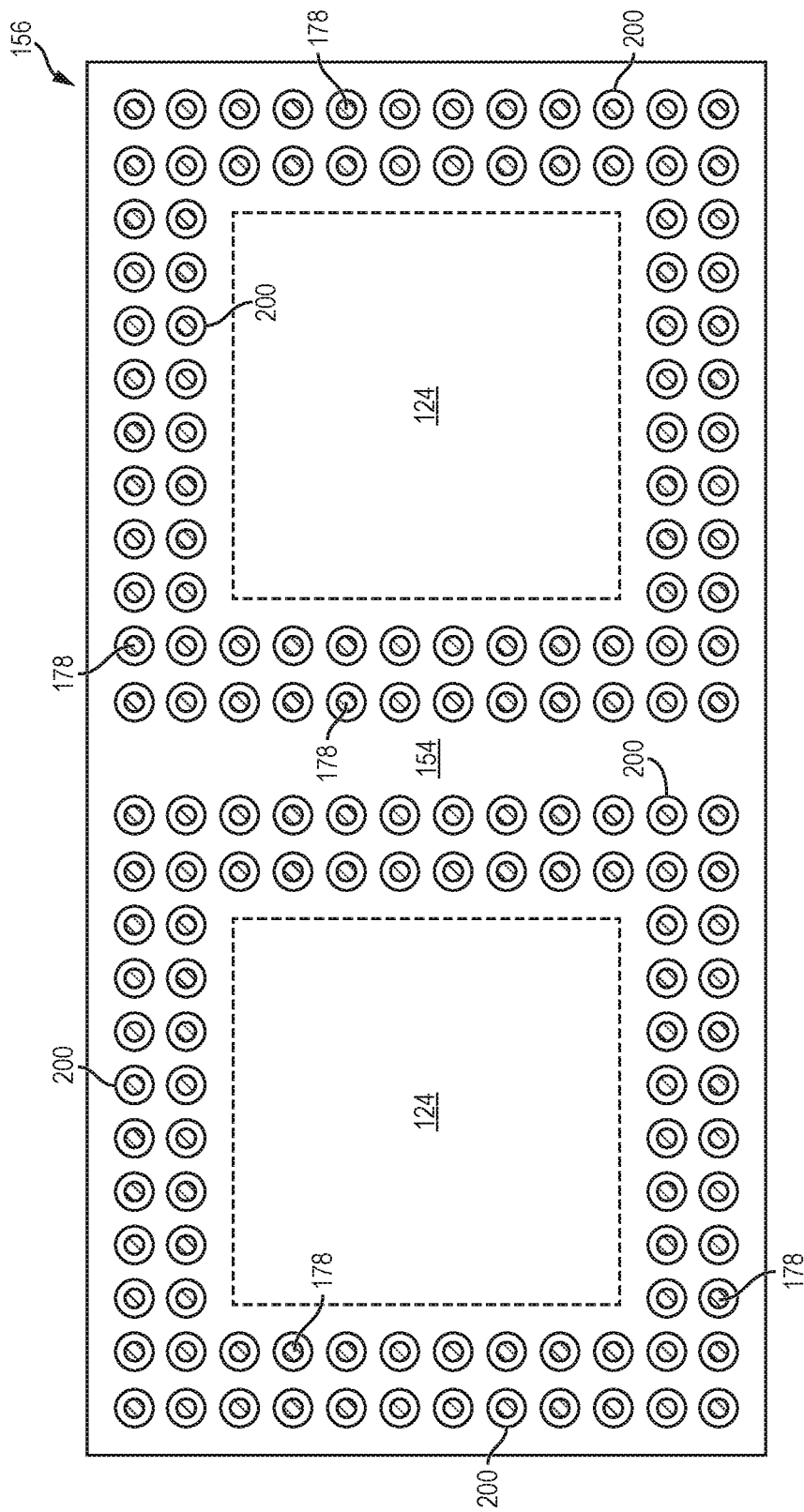

FIG. 4j shows a plan view of composite substrate 156 after removal of a portion of encapsulant 154. Semiconductor die 124 is surrounded and covered by encapsulant 154. Openings 200 are formed around semiconductor die 124 in encapsulant 154. Openings 200 extend down to surface 178 of conductive layer 172 and include tapered sidewalls. The tapered sidewalls of opening 200 are based on larger top diameter and smaller bottom diameter that helps to achieve stable solder ball loading during solder filling and stable solder heights for uniform PoP stacking.

Figure 4K:
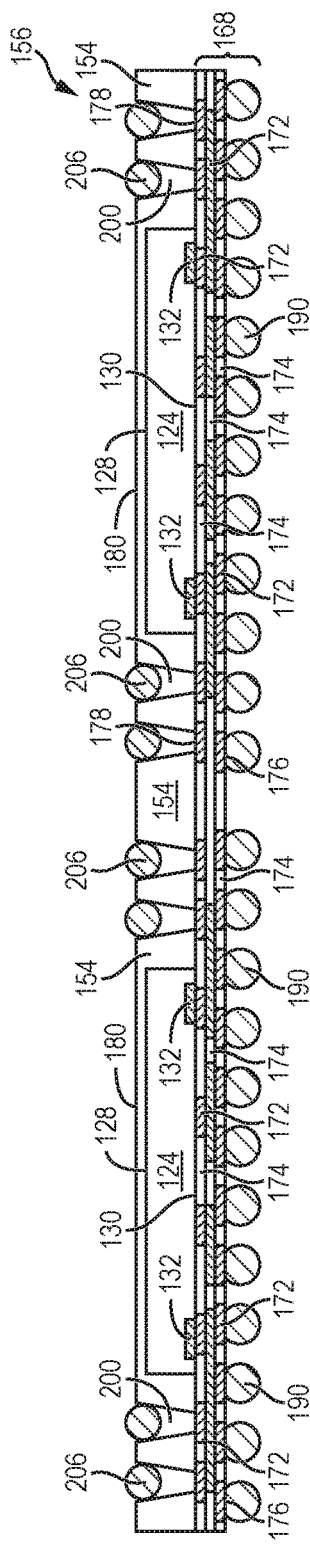

In FIG. 4k, an electrically conductive bump material 206 is deposited over opening 200 above the exposed conductive layer 172 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder.

Figure 4L:
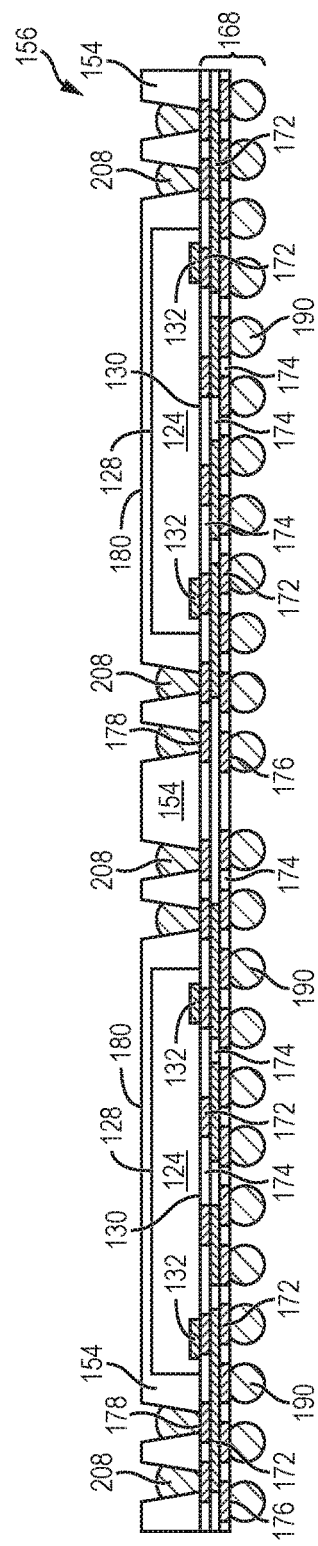

In FIG. 4l, the bump material is reflowed by heating the material above its melting point to form balls or bumps 208 over surface 178 of conductive layer 172. Bumps 208 are recessed within opening 200 to bond with conductive layer 172. In some applications, bumps 208 are reflowed a second time to improve electrical contact to conductive layer 172. Bumps 208 can also be compression bonded or thermocompression bonded to conductive layer 172. Bumps 208 represent one type of interconnect structure that can be formed over conductive layer 172. The interconnect structure can also use stud bump, micro bump, or other electrical interconnect. When an upper package is stacked over the lower package 220 to form a PoP device, the portion of opening 200 above interconnect 208 reduces the height of the PoP device by connecting the top and bottom packages within opening 200. The smaller package profile of semiconductor device 250 improves the thermal performance, electrical performance, and warpage behavior the semiconductor device by creating a thin, 3D PoP eWLB device.

Figure 4M:
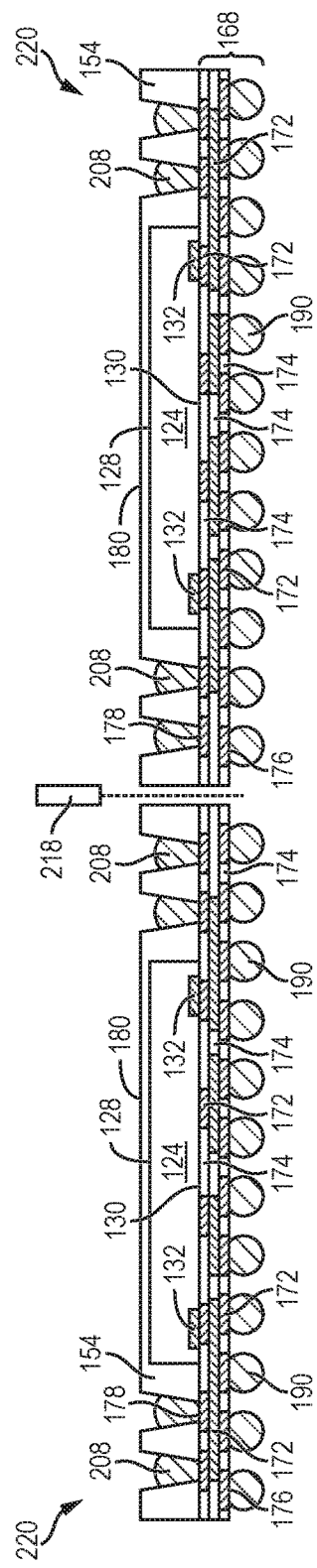

After the formation of bumps 208, composite substrate or reconstituted wafer 156 is singulated with saw blade or laser cutting device 218 into individual semiconductor devices 220 in FIG. 4m. By singulating composite substrate 156 before mounting additional semiconductor devices over the composite substrate, the formation of individual semiconductor devices 220 is accomplished by mounting the additional semiconductor die at the individual device level rather than at the reconstituted wafer level. Alternatively, composite substrate 156 is singulated after additional semiconductor devices are mounted to the composite substrate as shown in FIG. 5.

Figure 4N:
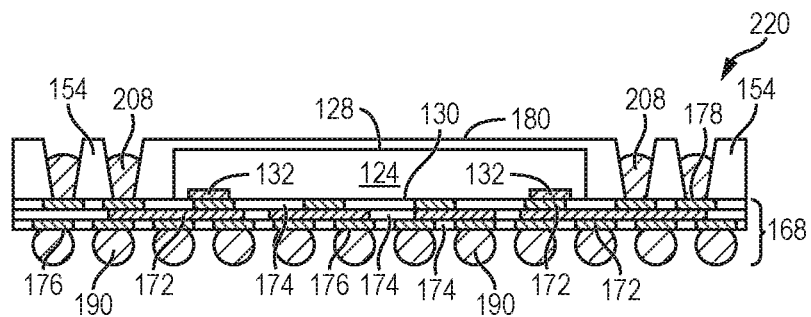

FIG. 4n shows an individual semiconductor device 220 after singulation. Semiconductor device 220 is an eWLB structure. In one embodiment, semiconductor device 220 has a height of 250 µm. Semiconductor device 220 includes recessed vertical interconnects or bumps 208 to accommodate high density semiconductor die, such as memory devices, in a flipchip orientation. Semiconductor device 220 also accommodates mixed semiconductor die sizes.

Figure 5:
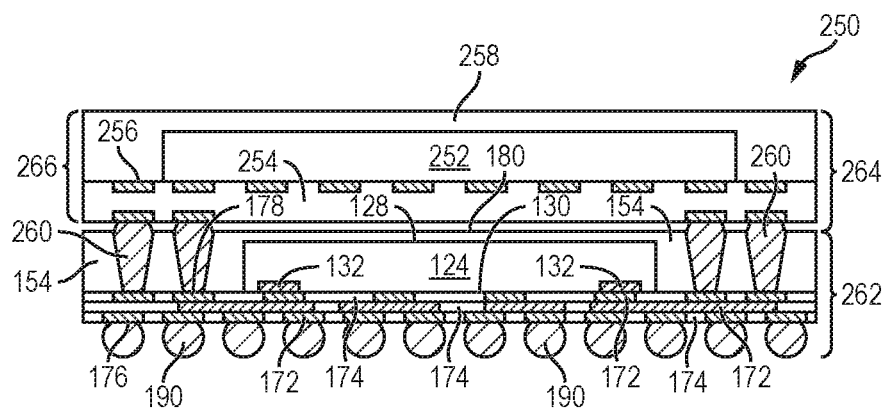
FIG. 5 illustrates a package on package device including a Fo-eWLB package having tapered vias formed around a semiconductor die.

FIG. 5 shows an individual semiconductor device 250 as a 3D PoP structure with semiconductor die 252 stacked over semiconductor die 124. Semiconductor device 250 also accommodates mixed semiconductor die sizes. For example, a semiconductor die having memory function and an application processor die can be integrated in a stacked configuration into semiconductor device 250.

Semiconductor die 252 is electrically connected to interconnect structure 254 through conductive layer 256. Encapsulant 258 surrounds semiconductor die 252 and can be polymer composite material, such as epoxy resin with filler, epoxy acrylate with filler, or polymer with proper filler. Encapsulant 258 is non-conductive, provides physical support, and environmentally protects the semiconductor device from external elements and contaminants. Semiconductor device 250 is further electrically connected through conductive vias 260 to accommodate semiconductor die 252, such as a memory device, in a flipchip orientation. Semiconductor device 250 has reduced thickness. In one embodiment, thickness 262 of the bottom package is 480 µm, the height 264 of the upper surface of the top package is 520 µm from the upper surface of the bottom package, and thickness 266 of the top package is 450 µm. Semiconductor device 250 has a package thickness of 970 µm. The package thickness of a stacked device using a conventional eWLB is 1.4 mm. The recessed interconnect structure 208 of FIG. 4n reduces the height of device 250 with the upper package stacked over the lower package because the portion of opening 200 above interconnect 208 negates the height of a portion of the interconnect structure of the upper package that electrically connects with interconnect structure 208 to form conductive via 260. The smaller package profile of semiconductor device 250 improves the thermal performance, electrical performance, and warpage behavior the semiconductor device by creating a thin, 3D PoP eWLB device.

Figure 6:
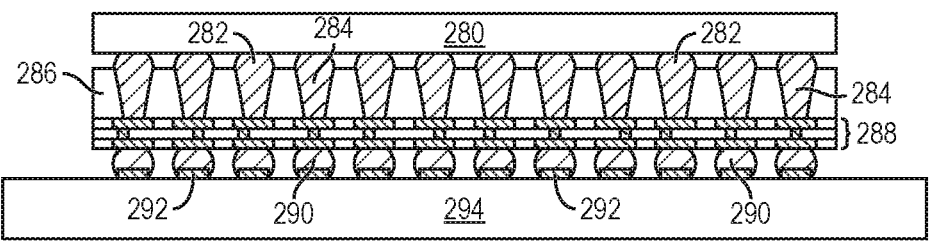
FIG. 6 illustrates a package on package device including a Fo-eWLB molded laser package (MLP) mounted to a printed circuit board.

FIG. 6 shows stacked packages assembled and mounted on a PCB in a PoP configuration including a bottom device as shown in FIGS. 4a-4n. The PoP assembly includes a top eWLB package 280 with a body thickness of 250 µm and a height of 500 µm. The total height of the eWLB-MLP stacked device, including top and bottom packages, is 750-770 µm. Package 280 contains a semiconductor die having an active surface electrically connected to bump material 282, which is deposited in opening 284. Opening 284 is tapered with a larger opening at the top and a smaller opening at the bottom. The tapered shape of opening 284 enables stable solder ball loading when inserting bump material into opening 284. The tapered via shape also provides stable bump material heights for uniform PoP stacking. Bump material 282 forms a conductive via through encapsulant 286 in opening 284 extending to interconnect structure 288. Interconnect structure 288 includes one or more conductive and insulating layers. Interconnect structure 288 is electrically connected through bump material 290 to contact pad 292 of circuit board or substrate 294. The tapered vias filled with conductive material increase package strength and robustness to reduce cracking and other damage to the interconnect structure during manufacturing processes, such as die bonding, carrier debonding, handling, and transportation. The smaller package profile of the semiconductor device improves the thermal performance, electrical performance, and warpage behavior of the semiconductor device by creating a thin, 3D PoP eWLB device.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   depositing an encapsulant around the semiconductor die to form a first surface of the encapsulant;
   planarizing the encapsulant to form a planar second surface of the encapsulant opposite the first surface;
   forming an interconnect structure under the first surface of the encapsulant and in contact with an active surface of the semiconductor die;
   forming an opening extending from the planar second surface of the encapsulant to the interconnect structure after forming the interconnect structure, wherein the opening includes a tapered sidewall formed by laser direct ablation; and
   forming a bump within the opening and connected to the interconnect structure.

2. The method of claim 1, further including forming a plurality of bumps under the interconnect structure.

3. The method of claim 1, wherein the semiconductor device includes a height less than 1 millimeter.

4. The method of claim 1, further including:
   providing a semiconductor package; and
   disposing the semiconductor package over the planar second surface of the encapsulant and electrically connected to the bump.

5. The method of claim 4, wherein the semiconductor package includes a memory device.

6. The method of claim 5, wherein the semiconductor package includes a substrate.

7. A method of making a semiconductor device, comprising:
   providing a substrate;
   disposing a semiconductor die over the substrate;
   depositing an encapsulant over the substrate and around semiconductor die including a first surface of the encapsulant coplanar with an active surface of the semiconductor die and a planar second surface of the encapsulant opposite the first surface of the encapsulant;
   removing the substrate;
   forming an interconnect structure under the first surface of the encapsulant, wherein a surface of the interconnect structure is in contact with the active surface of the semiconductor die;

forming an opening in the planar second surface of the encapsulant and extending to the surface of the interconnect structure after forming the interconnect structure; and forming a bump recessed within the opening of the encapsulant for external electrical interconnect.

8. The method of claim 7, wherein forming the interconnect structure further includes forming the interconnect structure under the semiconductor die.

9. The method of claim 7, further including forming of the opening in the encapsulant by laser direct ablation.

10. The method of claim 7, further including depositing a bump material over the opening of the encapsulant.

11. The method of claim 10, further including reflowing the bump material to form a bump recessed within the opening and connected to the interconnect structure.

12. The method of claim 7, further including:
providing a semiconductor package; and
disposing the semiconductor package over the semiconductor die and encapsulant.

13. The method of claim 12, wherein the semiconductor package includes a memory device.

14. A semiconductor device, comprising:
a semiconductor die;
a build-up interconnect structure formed over the semiconductor die with an active surface of the semiconductor die in contact with a surface of the build-up interconnect structure;
an encapsulant disposed around the semiconductor die including a first surface of the encapsulant coplanar with the active surface of the semiconductor die and a planar second surface of the encapsulant opposite the first surface of the encapsulant over a back surface of the semiconductor die opposite the active surface of the semiconductor die, wherein the encapsulant includes an opening formed in the planar surface extending to the surface of the build-up interconnect structure; and
a bump formed over the surface of the build-up interconnect structure and recessed within the opening of the encapsulant.

15. The semiconductor device of claim 14, wherein the opening includes a tapered sidewall.

16. The semiconductor device of claim 14, further including a plurality of bumps disposed under the build-up interconnect structure.

17. The semiconductor device of claim 14, wherein the semiconductor device includes a height less than 1 millimeter.

18. The semiconductor device of claim 14, further including a semiconductor package disposed over the encapsulant and electrically connected to the bump.

19. The semiconductor device of claim 18, wherein the semiconductor package includes a memory device.

20. A semiconductor device, comprising:
a semiconductor die;
a build-up interconnect structure in contact with an active surface of the semiconductor die;
an encapsulant disposed over the build-up interconnect structure and around the semiconductor die including a first surface of the encapsulant and a planar second surface of the encapsulant opposite the first surface of the encapsulant over a back surface of the semiconductor die opposite the active surface of the semiconductor die, wherein the encapsulant includes an opening formed in the planar surface extending to a surface of the build-up interconnect structure; and
a bump recessed within the opening of the encapsulant.

21. The semiconductor device of claim 20, wherein the opening includes a tapered sidewall.

22. The semiconductor device of claim 20, further including a plurality of bumps disposed under the build-up interconnect structure.

23. The semiconductor device of claim 20, wherein the semiconductor device includes a height less than 1 millimeter.

24. The semiconductor device of claim 20, further including a semiconductor package disposed over the encapsulant and electrically connected to the bump.

25. The semiconductor device of claim 24, wherein the semiconductor package includes a memory device.

* * * * *